US012660498B2

(12) United States Patent　　　　　(10) Patent No.:　US 12,660,498 B2
Etgar et al.　　　　　　　　　　　　(45) Date of Patent:　Jun. 16, 2026

(54) SOLAR ENERGY AND AGROPRODUCTION STRUCTURES AND FACILITIES

(71) Applicant: YISSUM RESEARCH DEVELOPMENT COMPANY OF THE HEBREW UNIVERSITY OF JERUSALEM LTD., Jerusalem (IL)

(72) Inventors: Lioz Etgar, Jerusalem (IL); Haim David Rabinowitch, Kiryat Ono (IL)

(73) Assignee: YISSUM RESEARCH DEVELOPMENT COMPANY OF THE HEBREW UNIVERSITY OF JERUSALEM LTD, Jerusalem (IL)

( * ) Notice: Subject to any disclaimer, the term of this patent is extended or adjusted under 35 U.S.C. 154(b) by 32 days.

(21) Appl. No.: 18/258,509

(22) PCT Filed: Dec. 20, 2021

(86) PCT No.: PCT/IL2021/051505

§ 371 (c)(1),
(2) Date: Jun. 20, 2023

(87) PCT Pub. No.: WO2022/137231

PCT Pub. Date: Jun. 30, 2022

(65) Prior Publication Data

US 2024/0047143 A1　　Feb. 8, 2024

Related U.S. Application Data

(60) Provisional application No. 63/128,514, filed on Dec. 21, 2020.

(51) Int. Cl.
H10K 85/50　　　(2023.01)
A01G 9/24　　　(2006.01)
(Continued)

(52) U.S. Cl.
CPC .............. H10K 85/50 (2023.02); F24S 80/52 (2018.05); H01G 9/2009 (2013.01); H02S 20/23 (2014.12);
(Continued)

(58) Field of Classification Search
CPC ........ H10K 30/30; H10K 30/50; H10K 30/86; H10K 85/05
See application file for complete search history.

(56) References Cited

U.S. PATENT DOCUMENTS 8,418,401 B2　　4/2013　Chuang
11,916,180 B2 *　2/2024　Lee ................... H10K 85/6576
(Continued)

FOREIGN PATENT DOCUMENTS

EP　　　　3855509 A1 *　7/2021　............. H10K 85/50
WO　　2016/110851 A1　　7/2016
WO　WO-2019050906 A1 *　3/2019　............. H10K 85/30

OTHER PUBLICATIONS

G. E. Eperon, V. M. Burlakov, A. Goriely and H. J. Snaith, "Neutral color Semitransparent Microstructured Provskite Solar Cells", ACS Nano, 2014, 8 (1), 591-598.
(Continued)

*Primary Examiner* — Golam Mowla
(74) *Attorney, Agent, or Firm* — FISHERBROYLES, LLP; Roger L. Browdy

(57) ABSTRACT

The invention concerns a transparent or semitransparent film comprising a perovskite material absorbing light within the photosynthetically active radiation (PAR) spectrum.

10 Claims, 8 Drawing Sheets

(51) Int. Cl.

| | |
|---|---|
| *F24S 80/00* | (2018.01) |
| *F24S 80/52* | (2018.01) |
| *H01G 9/20* | (2006.01) |
| *H02S 20/23* | (2014.01) |
| *H10K 30/50* | (2023.01) |
| *H10K 30/86* | (2023.01) |

(52) U.S. Cl.
CPC ............. *H10K 30/50* (2023.02); *H10K 30/86* (2023.02); *A01G 9/243* (2013.01); *F24S 2080/011* (2018.05)

(56) References Cited

U.S. PATENT DOCUMENTS

| | | | | |
|---|---|---|---|---|
| 2016/0141535 | A1* | 5/2016 | Snaith | H10K 85/50 438/82 |
| 2020/0343053 | A1* | 10/2020 | Lunt | H10K 30/82 |
| 2021/0242357 | A1* | 8/2021 | Gamelin | C09K 11/06 |
| 2023/0050607 | A1* | 2/2023 | Andriessen | H02S 20/26 |

OTHER PUBLICATIONS

L. K. Ono, S. Wang, Y. Kato, S. R. Rega and Y. Qi, "Fabrication of Semi-Transparent Perovskite Films with Centimeter-Scale Superior Uniformity by the Hybrid Deposition Method", Energy Environ. Sci., 2014.

Cristina Roldan, Olga Malinkiewicz, Rafael Betancur, Giulia Longo, Cristina Momblona, Franklin Jaramillo, Luis Camacho and Henk J. Bolink "High efficiency single-junction semitransparent perovskite solar cells", Energy & Environmental Science, 2014.

D. P. McMeekin et al., "A mixed-cation lead mixed-halide perovskite absorber for tandem solar cells", Science, vol. 351, No. 6269, Jan. 8, 2016 (Jan. 8, 2016), p. 151-155.

Waqas Siddique Subhani et al, "Anti-solvent engineering for efficient semitransparent CH3NH3PbBr3 perovskite solar cells for greenhouse applications", Journal of Energy Chemistry, vol. 34, Oct. 18, 2018 (Oct. 18, 2018), p. 12-19.

* cited by examiner

Absorption spectra of chlorophylls a and b, and carotenoid pigments.

(a)

(b)

SOLAR ENERGY AND AGROPRODUCTION STRUCTURES AND FACILITIES

BACKGROUND OF THE INVENTION

Organic-inorganic perovskites are attractive materials used as light harvesters in solar cells. Their electronic properties can be made to order, allowing for the formation of layered materials, to control the distance and the electronic coupling between the inorganic sheets according to the structure of the organic component employed.

To date, there have been only a few reports about the development of semi-transparent perovskite solar cells. Eperon et al [1] used a strategy which relied on de-wetting of a perovskite film to create 'perovskite islands', hence achieving high light transmittance while decreasing the overall Photovoltaic Cell Efficiency (PCE) due to the voids within the active layer. In other reports [2,3], a thin perovskite layer was deposited by evaporation.

International Patent Publication No. WO2016/110851 [4], to some of the inventors of the present application, concerns a continuous material pattern having a plurality of material-free voids, the material comprising at least one perovskite material. The pattern is transparent-semitransparent and can be used for the construction of perovskite-based electronic or optoelectronic devices (e.g., solar cells).

U.S. Pat. No. 8,418,401 [5] concerns a silicone based photovoltaic greenhouse for culturing plants comprising a transmissive thin-film solar cell module mounted on the roof for partially absorbing a pre-selected light band of sunlight into electricity and allowing a transmitted sunlight to pass to the plants. Typically, the thin film solar module is composed of an amorphous silicon thin-film solar cell module, a microcrystalline silicon thin-film solar cell module, and a nano-crystalline silicon thin-film solar cell module.

REFERENCE

[1] G. E. Eperon, V. M. Burlakov, A. Goriely and H. J. Snaith, "Neutral color Semitransparent Microstructured Provskite Solar Cells", ACS Nano, 2014, 8 (1), 591-598.

[2] L. K. Ono, S. Wang, Y. Kato, S. R. Rega and Y. Qi, "Fabrication of Semi-Transparent Perovskite Films with Centimeter-Scale Superior Uniformity by the Hybrid Deposition Method", Energy Environ. Sci., 2014.

[3] Cristina Roldan, Olga Malinkiewicz, Rafael Betancur, Giulia Longo, Cristina Momblona, Franklin Jaramillo, Luis Camacho and Henk J. Bolink "High efficiency single-junction semitransparent perovskite solar cells", Energy & Environmental Science, 2014.

[4] International Patent Publication No. WO 2016/110851.

[5] U.S. Pat. No. 8,418,401.

General Description of the Invention

The invention disclosed herein is based on the inventors finding that a material film composed of a certain group of perovskite materials, while being transparent or semitransparent to visible light, can absorb light of certain wavelengths. More specifically, it was found that perovskite materials capable of absorbing light of wavelengths below a certain threshold or threshold range (e.g. $\lambda 1$), and further capable of transmitting light of longer wavelengths (e.g., $\lambda 2$, above the certain threshold or outside the threshold range) can be utilized in a variety of enclosed agricultural facilities to improve plant growing conditions by modulating the growing temperatures in the enclosed environments.

Films of the perovskite material(s) were used by the inventors for constructing transparent or semitransparent solar panels capable of absorbing light (and thus generating electricity) and at the same time transmit light within the photosynthetically active radiation (PAR) spectrum. This unique phenomenon involving absorbance and transmittance within the PAR spectrum enables a gamut of utilities, including, for example:

generating electricity for powering, e.g., agricultural facilities such as greenhouses, as light is absorbed by the panel perovskite material;

maintaining light-dependent growing processes, such as photosynthesis, as light of longer wavelengths are transmitted without interruption;

reducing growing temperatures due to filtration of incident light;

reducing aspiration of plants due to a reduction in growing temperatures, leading also to a reduction in water consumption;

reducing excessive use of precious land area used for construction of solar farms with the consequent generation of desert land, as shade areas cast by the standard photovoltaic (PV) panels limit production;

offsetting expensive cooling energy costs and increasing a possibility to self-supply foods and energy in regions where agriculture is less available and in newly reclaimed territories in warm climate regions which were previously unsuitable for food production due to excessive heat and water shortages; and others.

Thus, in a first of its aspects, the invention provides a transparent or semitransparent film comprising or consisting at least one light absorbing perovskite material, said perovskite material being capable of absorbing light within the photosynthetically active radiation (PAR) spectrum.

Also provided is a transparent or semitransparent film comprising or consisting at least one perovskite material absorbing light within the photosynthetically active radiation (PAR) spectrum. In other words, the invention provides a film of a material that is both transparent (demonstrating transmittance at certain wavelengths) and absorbing (demonstrating absorbance at certain other wavelengths), wherein both transmittance and absorbance are of light of wavelengths within the PAR spectrum.

In some embodiments, the perovskite material absorbs light of a wavelength below a wavelength within a range between 610 and 620 nm. In some embodiments, the perovskite material absorbs light below 610 nm.

The invention further concerns a transparent or semitransparent light absorbing perovskite film, absorbing light of wavelengths below 610 nm; or below or within the range 610 and 620 nm.

Further provided is a perovskite-based film having absorbance below a 610 nm and transmittance above 620 nm.

The term "light" generally refers to solar radiation or light of any other source comprising the infrared, visible and ultraviolet portions of the electromagnetic spectrum, having wavelengths ranging between 100 nm and 1 mm. Within this spectral range, the "photosynthetically active radiation spectrum, PAR" constitutes a portion of the solar radiation that plants and other photosynthetic organisms can use in the process of photosynthesis. Typically, the PAR spectrum ranges between 400 and 700 nm. Within the scope of the present invention, the PAR spectrum may be extended to wavelengths below 400 and above 700 nm, to an extended spectrum ranging from 100 nm to 1 mm, or any spectral range encompassed thereby.

As stated herein, perovskite materials of the invention exhibit light absorbance below a certain wavelength threshold, and light transmittance above the certain wavelength threshold. The threshold being a wavelength below which absorbance can be effectively used for generating electric power and at the same time a threshold above which transmittance is most effective in maintaining proper growing conditions by, directly or indirectly, reducing temperatures and water transpiration by plants. The inventors have surprisingly found that a wavelength between 610 and 620 nm provides an unexpected and superior threshold for achieving all benefits discussed above. Thus, in some embodiments, the wavelength threshold is between 610 and 620 nm; or is 610, 615 or 620 nm. In other embodiments, the threshold is 610 nm or 620 nm.

Reference to a light of a wavelength below 610 nm or below the range between 610 and 620 means light of a wavelength between 400 nm and 610 nm or between 400 and 620 nm, respectively. In some embodiments, absorbance may be achieved even at wavelengths between 100 and 400 nm. Thus, a light of a wavelength below 610 nm encompasses any light of a wavelength between 100 and 610 nm, 100 and 280 nm, 280 nm and 315 nm, 315 nm and 400 nm, or between 380 nm and 610 nm. Similarly, reference to a light of a wavelength above 620 nm means light of a wavelength between 620 and 700 nm. Transmittance may also be observed at longer wavelengths up to 1 mm. In some embodiments, the transmittance at a wavelength above 620 nm is at a wavelength between 700 nm and 1.4 microns, 1.4 and 3 microns or between 3 microns and 1 mm.

Films of the invention may be standalone films or may be in a form of a material coating or a material layer on a surface region of a substrate. A film may also be utilized in a device, wherein the film acts as a functional layer in the device. The thickness of the film/layer may be between 200 and 800 nm, or between 300 and 400 nm.

Films of the invention are typically in a form of a continuous layer of the perovskite material formed on a transparent substrate. Alternatively, the film may be in a shape or a pattern having perovskite domains or perovskite-free domains ("perovskite voids"). A non-limiting example of such a pattern and a non-limiting process for its preparation are disclosed in WO 2016/110851, herein incorporated by reference.

The films are regarded transparent or semitransparent for allowing light of wavelengths above 610 nm to transmit therethrough. The term "transparent" reflects on the film's ability to transmit at least 70, 75, 80, 85, 90, 95 or 99% of the incident light. The film is said to be "semitransparent" when the amount of light transmitted through the film is between 10 and 70% of the incident light. In cases of transparent films, low transmittance may be caused, for example, by forming the film on a substrate having reduced transparency. As low transparency is sometimes required to avoid excessive exposure to sunlight, for example for plants adapted to low radiation environments, tailoring of a low transparency or semitransparent films can be achieved, e.g., by forming the film on a substrate with a predefined (reduced) transparency.

In cases where the film is formed as a material coating or a material layer on a surface region of a substrate, the overall transparency may also depend on whether or not the substrate is transparent and on the degree of transparency. In some implementations, the film is formed on a surface region of a "transparent substrate" which transmits at least 50% of the light having wavelengths above 610 or 620 nm.

In some embodiments, and depending on the substrate, the substrate can transmit at least 55, 60, 65, 70, 75, 80, 85, 90, 95 or 99% of the light.

The substrate may be a flexible or a rigid substrate; it may be substantially two-dimensional (a thin flat substrate) or a three-dimensional curved (non-flat) surface. The substrate may be of any smoothness. In most general terms, the substrate may be of a solid material such as glass, paper, a semiconductor material, composed of an inorganic or organic material, a polymeric material or a ceramic material. The surface of the substrate on which the perovskite film is formed may not be of the same material as the bulk material of the substrate or object.

In some embodiments, the film is provided on a transparent substrate, which may be rigid or flexible, having a two-dimensional or three-dimensional (curved, out of plane) surface.

In some embodiments, the substrate is both transparent and conductive.

In some embodiments, the substrate is a layer or a coat in a multilayer structure, wherein the perovskite film is one of the layers or coats.

In some embodiments, the substrate is a patterned surface region of a non-perovskite material. The perovskite film may or may not follow the pattern on top of which it is formed.

In some embodiments, the substrate is flexible. In some embodiments, the substrate is conductive.

In some embodiments, the substrate is an inorganic semiconductor material, optionally selected from silicon, tin, compounds of boron, tellurium, germanium, gallium, gallium arsenide (GaAs), gallium phosphide (GaP), cadmium telluride (CdTe), gallium aluminum arsenide (GaAlAs), indium phosphide (InP), gallium arsenide phosphide (GaAsP), cadmium sulfide (CdS), copper indium gallium diselenide (CIGS), mercury cadmium telluride (HgCdTe), and copper indium sulfide or selenide.

In some embodiments, the substrate is selected from glass, porous glass, quartz, indium tin oxide (ITO), fluorinated tin oxide (FTO), antimony doped tin oxide (ATO), mica, $SrGeO_3$ or zinc oxide. In further embodiments, the substrate may be selected from $SnO_2$:F, $SnO_2$:Sb, $In_2SO_3$:Sn, ZnO:Al, $ZnO:Al_2O_3$ and $ZnO:Ga_2O_3$.

In some embodiments, the substrate is indium tin oxide (ITO) or fluorinated tin oxide (FTO).

In some embodiments, the substrate is formed of a polymeric material (conductive polymer), such as polyazulenes, polyphenylenes, polypyrenes, polynaphthalenes, polyester (PET), polyimide, poly(pyrrole)s (PPY), poly(thiophene)s (PT), poly(3,4-ethylenedioxythiophene) (PEDOT), polyazepines, polyindoles, polycarbazoles, poly(p-phenylene vinylene) (PPV), poly(acetylene)s (PAC), poly(p-phenylene sulfide) (PPS), poly-3-hexyl thiophene (P3HT) and polyanilines.

In some embodiments, the substrate is a carbon substrate or a Highly Ordered Pyrolytic Graphite (HOPG).

In some embodiments, the substrate is or comprises a metal. In some embodiments, the substrate comprises a transition metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg, any alloy thereof, oxide thereof or any combination thereof.

In some embodiments, the substrate is a metallic substrate made of a metal selected from gold, silver, copper, platinum, nickel, palladium, titanium, iridium and any combination thereof.

In some embodiments, the substrate is a glass or a plastic substrate composed of a glass material coated with a conductive material such as $SnO_2$:F (FTO) or metal nanoparticles (e.g., Au and/or Ag nanoparticles).

In some embodiments, the substrate may be selected from glass, porous glass, quartz, indium tin oxide (ITO), fluorinated tin oxide (FTO) and mica.

In cases the term "transparent" is used in a context other than the film or devices of the invention, i.e., in reference to a material other than the perovskite (e.g., a transparent conductive layer, a transparent hole layer, a transparent non-roof walls of the greenhouse), it stands to mean transmission of at least 20%, 30%, 40%, 50%, 60%, 70% or 80% of the incident sunlight.

The invention further provides a device implementing a perovskite film according to the invention. The device may be an electrical device or a photoelectric device. In some embodiments the photoelectric device is a photovoltaic device (cell).

In some embodiments, the device is a sensitizer, a light harvester or a light concentrator.

The photovoltaic cell implementing the perovskite film of the invention may be of any configuration known in the art.

In some embodiments, the photovoltaic device is configured as a solar panel. The device or panel may be shaped or adapted as a roof panel for agricultural facilities and structures. In accordance with the invention, the wavelength range that is transmitted through (or not absorbed by) the perovskite film is suitable for maintaining growth of plants and algae and support processes such as photosynthesis, photomorphogenesis and others. Typically, the energy transmitted, not absorbed by the perovskite layer is of a wavelength above 610 nm. As shown in FIG. 1, both chlorophyll a and the chlorophyll b exhibit absorption spectra with absorption peaks at wavelengths above 610 nm. A perovskite material that exhibits combined absorption wavelengths below 610 nm and transmission wavelengths above 610 nm thus enables construction of agricultural devices that are unique and superior to generic photovoltaic cells currently known in the art.

In some embodiments, the photovoltaic device comprises a semitransparent perovskite layer, as described herein, and at least one conductive layer. The conductive layer may be a transparent substrate on which the perovskite film is formed. Alternatively, the substrate is a transparent non-conductive material and conductivity is conferred by a separate conductive element that does not reduce device transparency. Such a conductive element may be in the form of a grid (net or pattern) of conductive wires that are thin enough not to impair layer or device transparency.

In some embodiments, the at least one conductive layer is provided on top of the perovskite layer. In some embodiments, the conductive layer is or comprises a metal, either in pure form or a metal alloy. In some embodiments, the conductive layer comprises a transition metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir, Hg and any combination thereof.

In further embodiments, the conductive layer comprises a metal, such as gold, silver, copper, platinum, nickel, palladium, titanium, iridium or any combination thereof.

In other embodiments, the conductive layer comprises Au and/or Ag.

In some embodiments, the conductive layer is a carbon substrate or HOPG.

In some embodiments, the conductive layer is an inorganic semiconductor material, including but not limited to, silicon, tin, compounds of boron, tellurium, germanium, gallium, gallium arsenide (GaAs), gallium phosphide (GaP), cadmium telluride (CdTe), gallium aluminum arsenide (GaAlAs), indium phosphide (InP), gallium arsenide phosphide (GaAsP), cadmium sulfide (CdS), copper indium gallium diselenide (CIGS), mercury cadmium telluride (HgCdTe), and copper indium sulfide or selenide.

In some embodiments, the device is an active component such as a sensitizer, a light harvesting device or a light concentrator that comprises or consists a substrate, at least one perovskite layer or film of the invention, at least one conductive layer (which may be the substrate), optionally a scaffold structure layer, and further optionally at least one hole conductive layer.

The invention further provides a photovoltaic device comprising a perovskite layer or film according to the invention, the photovoltaic cell being configured to selectively convert light having a wavelength $\lambda 1$ within the PAR spectrum to electricity, while transmitting light of a wavelength longer than $\lambda 1$.

In some embodiments, wherein $\lambda 1$ is below 610 nm and the wavelength being longer than $\lambda 1$ (designated $\lambda 2$) is above 610 or 620 nm.

In some embodiments, the photovoltaic device comprises or consists a substrate, at least one perovskite layer or film according to aspects of the invention, at least one conductive layer (which may be the substrate), optionally a scaffold structure layer, and further optionally at least one hole conductive layer.

In some embodiments, the photovoltaic device has the construction depicted in FIG. 2A.

In some embodiments, the photovoltaic device comprises:
  a conductive transparent substrate, e.g., a glass coated with a conductive layer (FTO, ITO);
  a layer of a perovskite material according to the invention;
  optionally a hole transporter layer; and
  a metal contact.

In some embodiments, the device further comprises
  a titanium oxide continuous conductive layer; and
  a titanium oxide particulate layer.

In some embodiments, the photovoltaic device is an inverted device, wherein the order of layers is reversed. In such a configuration, the device comprises a substrate layer, a hole transport layer, a perovskite layer and a topmost conductive layer.

FIG. 2B shows a schematic illustration of a layer stack in a complete inverted architecture device where [2-(3,6-dimethoxy-9H-carbazol-9-yl)ethyl]phosphonic acid (MeO-2PACz) serves as the hole transport layer and the PCBM and BCP are the electron transport layer.

In some embodiments, a mesoporous titanium oxide layer is not present.

The hole transport material may be made of a conductive polymer such as 2,2',7,7'-tetrakis[N,N-di(4-methoxyphenyl)amino]-9,9'-spirobifluorene (Spiro OMETAD), [2-(3,6-dimethoxy-9H-carbazol-9-yl)ethyl]phosphonic acid (MeO-2PACz), polyazulenes, polyphenylenes, polypyrenes, polynaphthalenes, polyester (PET), polyimide, poly(pyrrole)s (PPY), poly(thiophene)s (PT), poly(3,4-ethylenedioxythiophene) (PEDOT), polyazepines, polyindoles, polycarbazoles, poly(p-phenylene vinylene) (PPV), Poly (acetylene)s (PAC), poly(p-phenylene sulfide) (PPS), poly-3-hexyl thiophene (P3HT), and polyanilines.

In some embodiments, the hole transport layer is flexible.

In some embodiments, the hole transport layer is conductive.

In some embodiments, the hole transport layer is transparent.

In some embodiments, the hole transport layer is transparent to all wavelengths used in the final device. In some embodiments, the hole transport layer is transparent to all wavelengths used in a solar cell. In some embodiments, the hole transport layer is transparent in the visible spectral regime. In some embodiments, the hole transport layer is transparent in the NIR and/or IR spectral regime. In some embodiments, the hole transport layer is transparent in the visible-IR spectral regime.

As used herein, the terms 'film' and 'layer' are interchangeable. With reference to a multilayered device, e.g., a photovoltaic device, being a mono-, bi- or otherwise multilayer structure, the term "layer" is meant to signify a full layer, or a film on top or below a different layer or film, or one or more spaced apart regions of one material covering a different layer of a different material. A pattern may also be referred to as a "layer", or a "patterned layer". The spaced-apart regions may be regions of a material(s) (layer and/or stacked layers or patterns) separated by a region(s) of atoms (material) of a different material or other layer or stacked layers or material-free region(s). In some embodiments, the layer is a partial layer. In some embodiments, the partial layer is continuous or comprising separate regions (spaced apart, non-connected).

In some embodiments, the conductive layer partially covers the perovskite pattern or one or more additional layer(s). In some embodiments, the perovskite pattern partially covers the substrate.

Films of the invention, including stacked layers, may be provided in certain patterns on the substrate. The patterns may be repetitive or random. The patterns may be of any shape, e.g., repetitive or non-repetitive, cubes, rings, circles, strips, grid. The pattern size may be in the nanometer scale or in the micrometer scale or in the millimeter scale.

In some embodiments, the at least one conductive layer is at least one (continuous) conductive pattern. In some embodiments, the at least one conductive layer is at least one (continuous) hole conductive pattern. In some embodiments, the at least one additional layer is at least one (continuous) additional pattern. In some embodiments, the at least one additional layer and the at least one conductive layer are (continuous) patterned.

In some embodiments, all layers in a device or element of the invention are patterned.

The different patterns may be stacked on each other. Each pattern may follow the contour lines of a previous pattern and may have substantially or about the same dimensions. The patterns may be stacked in a concentric way.

In some embodiments, the conductive pattern is stacked on (or positioned below) the perovskite pattern, concentrically. In some embodiments, the additional pattern is stacked on the perovskite pattern, or vice versa, concentrically. In some embodiments, the conductive pattern, the additional pattern, the perovskite pattern is stacked concentrically.

In some embodiments, at least one layer or pattern or all of the layers or patterns are flexible.

In some embodiments, at least one layer or pattern or all of the layers or patterns is semi-transparent or transparent. In some embodiments, at least one layer or pattern or all of the layers or patterns is conductive The perovskite material exhibiting both absorbance and transmission characteristics, as defined herein, comprises or consists one or more perovskite species, encompassing any perovskite structure known in the art. The perovskite material is typically characterized by the structural motif $AMX_3$, having a three-dimensional network of corner-sharing $MX_6$ octahedra, wherein M is a metal cation that may adopt an octahedral coordination of the X anions, and wherein A is a cation typically situated in the 12-fold coordinated holes between the $MX_6$ octahedra.

In some embodiments, A and M are cations, i.e., the perovskite material is a metal oxide perovskite material. In other embodiments, A is an organic cation and M is a metal cation, i.e., the perovskite material is an organic-inorganic perovskite material.

The organic-inorganic perovskite material is an organic-inorganic hybrid structure. The organic-inorganic material encompasses self-assembled arrangements as alternate sheets (in a defined pattern of the invention), wherein the electronic coupling between the sheets and their distance from each other control the electronic properties.

The organic-inorganic perovskite structure of the invention encompasses any such structure known in the art.

The organic component may consist of a plurality of sheets, one or more, each comprising organic cations. In some embodiments, the organic component is composed of a single organic sheet (e.g., mono-ammonium), the cations and halogens being in one inorganic sheet, with the organic groups extending into a space between the inorganic sheets. In other embodiments, where the organic component is composed of two sheets (e.g., di-ammonium cations), the molecules extend into the distance between the organic sheets.

The organic groups may comprise an alkyl chain or a single-ring aromatic group. These organic layers help define the degree of interaction between the inorganic sheets and the properties developing in the inorganic sheets. These important modifications may be the result of varying the stoichiometry or composition of the organic and inorganic salts in the precursors' solution used to grow the films or crystals (in a defined pattern of the invention). The layered (multiple sheets) perovskite described demonstrates that the inorganic sheets can determine the formation of single crystalline layers, which would achieve higher mobilities (higher electron and holes mobilities).

In some embodiments, the structure of the organic-inorganic perovskites resembles a multilayer structure, with semiconducting inorganic sheets alternating with organic sheets. The organic sheets may have a large energy gap.

In some embodiments, the conduction band of the inorganic sheets is substantially below that of the organic sheets, and the valence band of the inorganic sheets may be similarly above that of the organic sheets, forming a type I band structure.

In some embodiments, the band gaps of the organic and inorganic sheets may be in a staggered configuration forming a type II band structure.

In some embodiments, the perovskite material is a three-dimensional material.

In some embodiments, the perovskite material is a two-dimensional material.

In some embodiments, the perovskite material is of the formula $$AMX_3 \text{ or}$$

$$AMX_4 \text{ or}$$

$$A_2MX_4 \text{ or}$$

$$A_3MX_5 \text{ or}$$

$$A_2A'MX_5 \text{ or}$$

$$AMX_{3-n}X'n,$$

wherein, in each of the above formulae, independently:

each A and A' are independently selected from organic cations, metal cations and any combination of such cations;

M is a metal cation or any combination of metal cations;

each X and X' are independently selected from anions and any combination of anions; and n is between 0 to 3.

Repeating or multiple elements in any of the above perovskite formulae (e.g., $A_2$ or $X_4$ in $A_2MX_4$) may be the same or different. For example, $A_2MX_4$ may be of the structure AA'MXX'X"X"'.

The cation and anion moieties may be in any valence number. In some embodiments, the cation and/or the anion have a valence number of 1 or 2 or 3 or 4 or 5 or 6 or 7. In some embodiments, the cation and/or the anion is a monovalent atom. In some embodiments, the cation and/or the anion is a divalent atom. In some embodiments, the cation and/or the anion is a trivalent atom.

The metal cations may be selected from a metal element of Groups IIIB, IVB, VB, VIB, VIIB, VIIIB, IB, IIB, IIIA, IVA and VA of block d of the Periodic Table of the Elements.

In some embodiments, the metal cation is Li or Mg or Na or K or Rb or Cs or Be or Ca or Sr or Ba, Sc or Ti or V or Cr or Fe or Ni or Cu or Zn or Y or La or Zr or Nb or Tc or Ru or Mo or Rh or W or Au or Pt or Pd or Ag or Co or Cd or Hf or Ta or Re or Os or Ir or Hg or B or Al or Ga or In or Tl or C or Si or Ge or Sn or Pb or P or As or Sb or Bi or O or S or Se or Te or Po or any combination thereof.

In some embodiments, the metal cation is a transition metal selected from Groups IIIB, IVB, VB, VIB, VIIB, VIIIB, IB and IIB of block d the Periodic Table. In some embodiments, the transition metal is a metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg or any combination thereof.

In some embodiments, the metal cation is a post-transition metal selected from Group IIIA, IVA, and VA. In some embodiments, the metal cation is Al or Ga or In or Tl or Sn or Pb or Bi or any combination thereof.

In some embodiments, the metal cation is a semi-metal selected from Group IIIA, IVA, VA and VIA. In some embodiments, the metal cation is B or Si or Ge or As or Sb or Po or any combination thereof.

In some embodiments, the metal cation is an alkali metal selected from Group IA. In some embodiments, the metal cation is an alkali metal Li or Mg or Na or K or Rb or Cs.

In some embodiments, the metal cation is an alkaline earth metal selected from Group IIA. In some embodiments, the metal cation is Be or Ca or Sr or Ba.

In some embodiments, the metal cation is a lanthanide element such as Ce or Pr or Gd or Eu or Tb or Dy or Er or Tm or Nd or Yb or any combination thereof.

In some embodiments, the metal cation is an actinides element such as Ac or Th or Pa or U or Np or Pu or Am or Cm or Bk or Cf or Es or Fm or Md or No or Lr or any combination thereof.

In some embodiments, the metal cation is a divalent metal cation. Non-limiting examples of divalent metals include $Cu^{+2}$, $Ni^{+2}$, $Co^{+2}$, $Fe^{+2}$, $Mn^{+2}$, $Cr^{+2}$, $Pd^{+2}$, $Cd^{+2}$, $Ge^{+2}$, $Sn^{+2}$, $Pb^{+2}$, $Eu^{+2}$ and $Yb^{+2}$.

In some embodiments, the metal cation is a trivalent metal cation. Non-limiting examples of trivalent metals include $Bi^{+3}$ and $Sb^{+3}$.

In some embodiments, the metal cation is $Pb^{+2}$.

The organic cations comprise at least one organic moiety (containing one or more carbon chain or hydrocarbon chain or one or more organic group). The organic moiety may be selected from substituted or unsubstituted alkyl, substituted or unsubstituted alkenyl, substituted or unsubstituted alkynyl, substituted or unsubstituted cycloalkyl, substituted or unsubstituted cycloalkenyl, substituted or unsubstituted cycloalkynyl, substituted or unsubstituted aryl, substituted or unsubstituted heteroaryl, substituted or unsubstituted heterocyclyl, substituted or unsubstituted —$NR_1R_2$, substituted or unsubstituted —$OR_3$, substituted or unsubstituted —$SR_4$, substituted or unsubstituted —$S(O)R_5$, substituted or unsubstituted alkylene-COOH, and substituted or unsubstituted ester.

The variable group denoted by "R", in any one of the generic descriptions e.g., —$NR_1R_2$, —$OR_3$, —$SR_4$, —$S(O)R_5$, refers to one or more group selected from hydrogen, alkyl, alkenyl, alkynyl, cycloalkyl, cycloalkenyl, cycloalkynyl, aryl, heteroaryl, heterocyclyl, halogen, alkylene-COOH, ester, —OH, —SH, and —NH, as defined herein or any combination thereof. In some embodiments, the number of R groups may be 0 or 1 or 2 or 3 or 4 or 5 or 6 or 7 or 8 or 9 or 20. As used herein, the group R refers generically to any specific R used herein, unless a specific definition is provided; in other words, the aforementioned definition refers to any of the R groups, e.g., R', R", R"', R"", $R_2$, $R_3$, $R_4$, $R_5$, $R_6$, $R_7$, $R_8$, etc, unless otherwise specifically noted.

In some embodiments, the perovskite material is a single species of a perovskite material. In other embodiments, the perovskite material is a combination of two or more (several) different species of different perovskite materials. In some embodiments, the number of different species of different perovskite materials may be 2 or 3 or 4 or 5 or 6 or 7 or 8 or 9 or 10 perovskite different perovskite species.

In some embodiments, the perovskite material, in a defined pattern or structure of the invention, is a multilayer structure of layered perovskite materials, wherein each layer is different and comprises either a different species of a perovskite material or a different mixture of several different species of perovskite materials. In some embodiments, each layer in a perovskite multilayer is made of a different combination or the same combination but with different ratios of perovskite materials.

In some embodiments, where the perovskite material is in a form of a multilayered perovskite material, each of the perovskite layers in the multilayer may be of the same perovskite material or of different perovskite materials. In some embodiments, the multilayer perovskite comprises 2 or 3 or 4 or 5 or 6 or 7 or 8 or 9 or 10 perovskite layers.

In some embodiments, the perovskite material comprises 2 or 3 or 4 or 5 or 6 or 7 or 8 or 9 or 10 different perovskite materials, each being selected and defined as above.

In some embodiments, the perovskite material comprises two perovskite materials at a ratio of 1:1 or 1:2 or 1:3 or 1:4 or 1:5.

In the organic moieties comprising the organic-inorganic hybrid material, the following definitions are applicable:

"alkyl", "alkenyl" and "alkynyl" carbon chains, if not specified, refers to carbon chains each containing from 1 to 20 carbons, or 1 or 2 to 16 carbons, and are straight or branched. Each such group may be substituted. In some embodiments, the carbon chain contains 1 to 10 carbon atoms. In some embodiments, the carbon chain contains 1 to 6 carbon atoms. In some embodiments, the carbon chain contains 2 to 6 carbon atoms. Alkenyl carbon chains may contain from 2 to 20 carbons, or 2 to 18 carbons, or 2 to 16 carbons, or 2 to 14 carbons, or 2 to 12 carbons, or 2 to 10 carbons, or 2 to 8 carbons, or 2 to 6 carbons, or 2 to 4 carbons. The alkenyl carbon chain may similarly contain 1 to 8 double bonds, or 1 to 7 double bonds, or 1 to 6 double bonds, or 1 to 5 double bonds, or 1 to 4 double bonds, or 1 to 3 double bonds, or 1 double bond, or 2 double bonds. Alkynyl carbon chains from 2 to 20 carbons, or 2 to 18 carbons, or 2 to 16 carbons, or 2 to 14 carbons, or 2 to 12, or carbons 2 to 10 carbons, or 2 to 8 carbons, or 2 to 6 carbons, or 2 to 4 carbons. The alkynyl carbon chain may similarly contain 1 to 8 triple bonds, or 1 to 7 triple bonds, or 1 to 6 triple bonds, or 1 to 5 triple bonds, or 1 to 4 triple bonds, or 1 to 3 triple bonds, or 1 triple bond, or 2 triple bonds. Exemplary alkyl, alkenyl and alkynyl groups include, but are not limited to, methyl, ethyl, propyl, isopropyl, isobutyl, n-butyl, sec-butyl, tert-butyl, isohexyl, allyl (propenyl) and propargyl (propynyl).

"cycloalkyl" refers to a saturated mono- or multi-cyclic ring system, in certain embodiments of 3 to 10 carbon atoms, in other embodiments 3 to 6 carbon atoms; cycloalkenyl and cycloalkynyl refer to mono- or multicyclic ring systems that respectively include at least one double bond and at least one triple bond. Cycloalkenyl and cycloalkynyl groups may, in some embodiments, may contain between 3 to 10 carbon atoms, in further embodiments, between 4 to 7 carbon atoms and cycloalkynyl groups, in further embodiments, containing 8 to 10 carbon atoms. The ring systems of the cycloalkyl, cycloalkenyl and cycloalkynyl groups may be composed of one ring or two or more rings which may be joined together in a fused, bridged or spiro-connected fashion.

"aryl" refers to aromatic monocyclic or multicyclic groups containing from 6 to 10 carbon atoms. Aryl groups include, but are not limited to groups such as unsubstituted or substituted fluorenyl, unsubstituted or substituted phenyl, and unsubstituted or substituted naphthyl.

"heteroaryl" refers to a monocyclic or multicyclic aromatic ring system, in certain embodiments, of about 5 to about 15 members where one or more, in some embodiments 1 to 3, of the atoms in the ring system is a heteroatom, that is, an element other than carbon, including e.g., nitrogen, oxygen or sulfur. The heteroaryl group may be optionally fused to a benzene ring. Heteroaryl groups include, but are not limited to, furyl, imidazolyl, pyrimidinyl, tetrazolyl, thienyl, pyridyl, pyrrolyl, thiazolyl, isothiazolyl, oxazolyl, isoxazolyl, triazolyl, quinolinyl and isoquinolinyl.

"heterocyclyl" refers to a saturated mono- or multi-cyclic ring system, in one embodiment of 3 to 10 members, in another embodiment of 4 to 7 members, in a further embodiment of 5 to 6 members, where one or more, in certain embodiments, 1 to 3, of the atoms in the ring system is a heteroatom, that is, an element other than carbon, including but not limited to, nitrogen, oxygen or sulfur. In embodiments where the heteroatom(s) is nitrogen, the nitrogen is optionally substituted with alkyl, alkenyl, alkynyl, aryl, heteroaryl, aralkyl, heteroaralkyl, cycloalkyl, heterocyclyl, cycloalkylalkyl, heterocyclylalkyl, acyl, guanidine, or the nitrogen may be quaternized to form an ammonium group where the substituents are selected as above.

"—$NR_1R_2$" refers to an amine group wherein $R_1$ and $R_2$ are independently selected from hydrogen, alkyl, alkenyl, alkenyl, cycloalkyl, cycloalkenyl, cycloalkynyl, aryl, heteroaryl, heterocyclyl, ester and carbonyl, each as defined herein or alternatively known in the art.

"—$OR_3$" refers to a hydroxyl group or an alkoxy group or derivative, wherein $R_3$ is selected from hydrogen, alkyl, alkenyl, alkenyl, cycloalkyl, cycloalkenyl, cycloalkynyl, aryl, heteroaryl, heterocyclyl, halogen, sulfinyl, ester and carbonyl.

"—$SR_4$" refers to a thiol group or a thioether group or derivative, wherein $R_4$ is selected from hydrogen, alkyl, alkenyl, alkenyl, cycloalkyl, cycloalkenyl, cycloalkynyl, aryl, heteroaryl, heterocyclyl, halogen, sulfinyl, ester and carbonyl.

"—$S(O)R_5$" refers to a sulfinyl group, wherein $R_5$ is selected from hydrogen, alkyl, alkenyl, alkenyl, cycloalkyl, cycloalkenyl, cycloalkynyl, aryl, heteroaryl, heterocyclyl, halogen, sulfinyl, ester and carbonyl.

"ester" refers to —$C(O)OR_8$ in which $R_8$ is selected from hydrogen, alkyl, alkenyl, alkenyl, cycloalkyl, cycloalkenyl, cycloalkynyl, aryl, heteroaryl, heterocyclyl, halogen, —$NR_1R_2$, sulfinyl, carbonyl, —$OR_3$, $SR_4$, —$S(O)R_5$—OH, —SH and —NH.

The term "substituted" refers to any group or any ligand as defined herein above having (further substituted) one or more substituent, wherein the substituent is a ligand as defined herein above. In some embodiments, the substituent is selected from alkyl, alkenyl, alkynyl, cycloalkyl, cycloalkenyl, cycloalkynyl, aryl, heteroaryl, heterocyclyl, halogen, alkylene-COOH, ester, —OH, —SH, and —NH. In some embodiments, the number of substituents on a certain ligand is 0 or 1 or 2 or 3 or 4 or 5 or 6 or 7 or 8 or 9 or 20 substituents.

The anion may be a simple anion or a halide anion or a chalcogenide anion or an organic anion or an oxoanion or any combination thereof.

In some embodiments, the anion is a simple anion, such as $O^{-2}$, $N^{-3}$, $S^{-2}$ or any combination thereof.

In some embodiments, the anion is a halide anion, wherein the halide may be F, Cl, Br, I, At or any combination thereof.

In some embodiments, the anion is selected from anions of an atom selected from S, Se, Te and any combination thereof.

In some embodiments, the anion is selected amongst organic anions such as acetate ($CH_3COO^-$), formate ($HCOO^-$), oxalate ($C_2O_4^{-2}$), cyanide ($CN^-$) or any combination thereof.

In some embodiments, the anion is an oxoanion such as $AsO_4^{-3}$, $AsO_3^{-3}$, $CO_3^{-2}$, $HCO_3^-$, $OH^-$, $NO_3^-$, $NO_2^-$, $PO_4^{-3}$, $HPO_4^{-2}$, $SO_4^{-2}$, $HSO_4^-$, $S_2O_3^{-2}$, $SO_3^{-2}$, $ClO_4^-$, $ClO_3^-$, $ClO_2^-$, $OCl^-$, $IO_3^-$, $BrO_3^-$, $OBr^-$, $CrO_4^{-2}$, $Cr_2O_7^{-2}$ or any combination thereof.

In some embodiments, the anion may be selected from $Br^-$, $I^-$, $NCS^-$, $CN^-$, and $NCO^-$. In further embodiments, the anion may be selected from $IBr^{-3}$, $Cl_2I^{-3}$, $Br_2I^{-3}$, and $I_2Cl^{-3}$.

In some embodiments, the perovskite material is an organic-inorganic perovskite structure. In some embodiments, the organic-inorganic perovskite structure is selected from $(R—NH_3)_2MX_4$ and $(NH—R—NH)MX$; (wherein X may be $Cl^{-1}$, $Br^{-1}$, or $I^{-1}$). The inorganic layers may consist of sheets of corner-sharing metal halide octahedra. The M cation may be a divalent or trivalent metal that satisfies charge balancing and adopts octahedral anion coordination.

The inorganic layers, usually referred to as perovskite sheets are derived from the three-dimensional $AMX_3$ perovskite structure, by typically making a one-layer-thick cut along the <100> direction of the three-dimensional crystal lattice. The structural modifications may be achieved by changing the compositions of the organic and inorganic salts in the starting solution to enable tailoring the electronic, optical, and magnetic properties.

In some embodiments, the organic cation is an organic monovalent cation.

In some embodiments, the organic cation is a primary, a secondary, a tertiary or a quaternary organic ammonium compound, including N-containing heterorings and ring systems.

In some embodiments, the organic cation is a carbon (hydrocarbon) chain comprising one or more heteroatoms. The heteroatoms may be selected from N, O, and S. In some embodiments, the number of heteroatoms is 1 or 2 or 3.

In some embodiments, the heteroatom is a nitrogen atom.

In some embodiments, the carbon chain comprises one or more halogens.

In some embodiments, the carbon chain comprises a heterocyclyl and/or a heteroaryl.

In some embodiments, the organic cation is a monovalent or a bivalent cation or any other valence number, which may be a primary, a secondary, a tertiary or a quaternary organic ammonium compound having two positively charged nitrogen atoms.

In some embodiments, in a perovskite structure as defined above, the cation (A or A') is an organic cation selected from $(RR'R''R'''N)^+$, wherein each of the R groups may be selected independently as defined herein In some embodiments the cation is selected from $RNH_3$, $RR'NH_2$, $R R'R''NH$, $NH_3RNH_3$ or any combination thereof. In some embodiments, the cation is selected from $RNH=R'$, $NH_2=R$, $RN=R'R''\cdot R'=N=R$, $RR'N=R=NR''R'''$, $H_2N=R=NH_2$, $RR'N=CHNR''R'''$. In some embodiments, the cation is $(H_2N=CHNH_2)^+$ or any combination thereof.

In some embodiments, the perovskite material is of the formula $AMX_3$.

In further embodiments, the perovskite material is of the formula $AMX'X_2$.

In yet further embodiments, the perovskite material is of the formula $RNH_3MX'X_2$.

In some embodiments, the perovskite material comprises or is selected from $CH_3NH_3PbF_3$, $CH_3NH_3PbCl_3$, $CH_3NH_3PbI_3$, $CH_3NH_3PbBr_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$ and $CH_3NH_3PbI_2Cl$. In some embodiments, the perovskite material comprises or is selected from $CH_3NH_3SnICl_2$, $CH_3NH_3SnBrI_2$, $CH_3NH_3SnBrCl_2$, $CH_3NH_3SnF_2Br$, $CH_3NH_3SnIBr_2$, $CH_3NH_3SnF_2I$, $CH_3NH_3SnClBr_2$, $CH_3NH_3SnI_2Cl$ and $CH_3NH_3SnF_2Cl$.

In further embodiments, the perovskite material is of the formula $RNH_3MX_3$. In some embodiments, the perovskite material comprises or is selected from $CH_3NH_3PbF_3$, $CH_3NH_3PbCl_3$, $CH_3NH_3PbI_3$, and $CH_3NH_3PbBr_3$. In some embodiments, the perovskite material is $CH_3NH_3PbI_3$.

In further embodiments, the perovskite material is of the formula $(NH_2=CH-NH_2) MX_3$. In some embodiments, the perovskite material comprises or is selected from $(NH_2=CH-NH_2)PbBr_3$, $(NH_2=CH-NH_2)PbI_3$, $(NH_2=CH-NH_2)PbCl_3$, $(NH_2=CH-NH_2) PbFCl_2$, $(NH_2=CH-NH_2)PbBrCl_2$, $(NH_2=CH-NH_2)PbICl_2$, $(NH_2=CH-NH_2)PbFCl_2$, $(NH_2=CH-NH_2)PbFBr_2$, $(NH_2=CH-NH_2)PbFI_2$ and $(NH_2=CH-NH_2)PbIBr_2$.

In further embodiments, the perovskite material is of the formula $AMX_3$, wherein M is a metal cation, i.e., $M'MX_3$. In further embodiments, the perovskite material is of the formula $M'MX'X_2$. In some embodiments, the perovskite material comprises or is selected from $CsPbI_2Cl$, $CsPbICl_2$, $CsPbI_2F$, $CsPbIF_2$, $CsPbI_2Br$ and $CsPbIBr_2$.

In some embodiments, the perovskite material comprises or is selected from $CsSnI_2F$, $CsSnIF_2$, $CsSnI_2Cl$, $CsSnICl_2$, $CsSnI_2Br$ and $CsSnIBr_2$ In some embodiments, the perovskite is of the form $MAPb(Br_{0.8}I_{0.2})_3$. In some embodiments, the metal cation is formamidinium and/or cesium having the structures, e.g., $CsFAPbX_3$ or $CsFAMAPbX_3$. In some embodiments, in a perovskite structure as defined above, the cation (A or A') is an organic cation selected from $(RR'R''R'''N)^+$, wherein each of the R groups may be selected independently as defined herein. In some embodiments the cation is selected from $RNH_3$, $RR'NH_2$, $R R'R''NH$, $NH_3RNH_3$ or any combination thereof.

In some embodiments, the perovskite is $MA_{0.25}FA_{0.75}Pb (I_{0.25}Br_{0.75})_3$.

In some embodiments, the perovskite is $Cs_{0.2}FA_{0.8}Pb (I_{0.3}Br_{0.7})_3$.

In some embodiments, the perovskite is $MA_nFA_{1-n}Pb (I_xBr_{1-x})_3$ (or is generally $MA$-$FA$-$Pb(IBr)_3$), wherein atom I (or variable x) is 0.2-0.3; atom Br (or variable 1-x) is 0.7-0.8; group MA (or variable n) is 0.2-0.3; and group FA (or variable 1-n) is 0.7-0.8.

In some embodiments, the perovskite is $Cs_nFA_{1-n}Pb (I_xBr_{1-x})_3$ (or is generally $Cs$-$FA$-$Pb(IBr)_3$, wherein atom Cs (or variable n) is 0.15-0.25; group FA (or variable 1-n) is 0.7-0.9; or atom I (or variable x) is 0.2-0.4; and atom Br (or variable 1-x) is 0.6-0.8.

In some embodiments, the perovskite comprises one or more Iodine atom.

The perovskite material used in films, structures and device of the invention is any of the herein disclosed perovskite material that is capable of absorbing light of wavelengths below 610 nm and further capable of transmitting light of longer wavelengths (above 610 or 620 nm). Such perovskite materials may be identified by measuring the absorbance and transmittance of the material. An onset at a wavelength within the region of 600-620 nm should provide an indication of suitability.

Spectrophotometers and other tools of analysis which can be used for determining suitability are known to a person versed in the art. Perovskite materials that have been identified as suitable by utilizing such methods of analysis include, without limitation, $MA_{0.25}FA_{0.75}Pb(I_{0.25}Br_{0.75})_3$, $Cs_{0.2}FA_{0.8}Pb(I_{0.3}Br_{0.7})_3$, $MA_nFA_{1-n}Pb(I_xBr_{1-x})_3$, $Cs_nFA_{1-n} Pb(I_xBr_{1-x})_3$, and others.

A perovskite band gap may be tuned to the required wavelength (610-620 nm). Tuning may be achieved by a variety of means, some include size and shape control, sequential deposition methods, lattice contraction and octahedral tilting, cation-induced tuning, tuning dimensionality and others. See for example J. Am. Chem. Soc. 139, 11117 (2017) or J. Mater. Chem. A, 2015, 3, Pp. 9171-9178 or J. Phys. Chem. C, 2014, 118, Pp. 17160-17165.

In some embodiments, perovskites suitable for films, structures and devices of the invention are iodide-rich materials.

The invention further concerns an agricultural structure comprising a solar panel or a photovoltaic device that is optionally provided on the structure's roof or which is configured as a part of the structure's roof or top panel. In a structure of the invention, the sidewalls may be composed of regular covering materials that are transparent to light, e.g., to the full spectrum of solar radiation. Such materials may be made of glass, plastic sheeting, plastic films, provided with or without additives. Alternatively, the structure can be wall-less or partially enclosed by transparent walls as above.

The invention further provides an agricultural structure comprising (i) a solar panel or a photovoltaic device provided on the structure's roof and/or (ii) a roof panel or top panel being the solar panel or the photovoltaic device, the device being a device according to the invention.

In some embodiments, the structure comprises a solar panel or a photovoltaic device implementing $MA_{0.25}FA_{0.75}Pb(I_{0.25}Br_{0.75})_3$.

In some embodiments, the structure comprises a solar panel or a photovoltaic device implementing $Cs_{0.2}FA_{0.8}Pb$ $(I_{0.3}Br_{0.7})_3$.

In some embodiments, the structure comprises a solar panel or a photovoltaic device implementing $MA_nFA_{1-n}Pb$ $(I_xBr_{1-x})_3$, wherein each of x and n, independently of the other, is between 0.2 and 0.3.

In some embodiments, the structure comprises a solar panel or a photovoltaic device implementing $Cs_nFA_{1-n}Pb$ $(I_xBr_{1-x})_3$ wherein n is between 0.15 and 0.25 and wherein x is between 0.2 and 0.4.

Also provided is a solar panel implementing at least one perovskite material having an absorbance below 610 nm and transmittance above 610 or 620 nm.

In some embodiments, the solar panel is for generating electricity, wherein the solar panel is configured as a roof panel.

In some embodiments, the solar panel is configured as a roof panel for agricultural enclosures.

Further provided is a method for reducing growing temperatures in an enclosed agricultural facility, the method comprising allowing a portion of incident solar radiation to irradiate into the facility through one or more solar panels implementing a film of a perovskite material having an absorbance below 610 nm and transmittance above 610 nm to thereby filtering the incident light and reducing temperatures within the facility. In some embodiments, the one or more solar panels are positioned on the roof of the facility; or the one or more solar panels are roof panels.

The "agricultural facility" or "agricultural structure" is a structure enclosing a piece of land used exclusively or mainly for in-door growing of fruits, vegetable, plants, flowers atc. The structure or facility may be a commercial surrounding such as a commercial growing facility or a private facility such as a private greenhouse. Generally speaking, the structure or facility may be of any size. It may be structured of a roof having one or more panels of the invention implemented therein and sidewalls composed of regular covering materials that are transparent to light, e.g., to the full spectrum of solar radiation. As agricultural structures of the invention can enjoy reduced inner temperatures due to filtration of light enabled by a perovskite material, as disclosed, and as a solar panel of the invention may also be used to generate electricity, the structures or facilities may be regarded as sustainable. For example, a greenhouse structured with a solar panel of the invention may be heated partly by the solar rays and partly by electricity generated by the panel, thereby manging energy consumption and losses, as well as the growing conditions in the facility.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

(FIG. 3B) The absorbance of plant's pigments in the chloroplast.

(FIG. 4B) a picture taken of the solar cell with 600 nm wavelength cutoff.

DETAILED DESCRIPTION OF THE INVENTION

Figure 1:
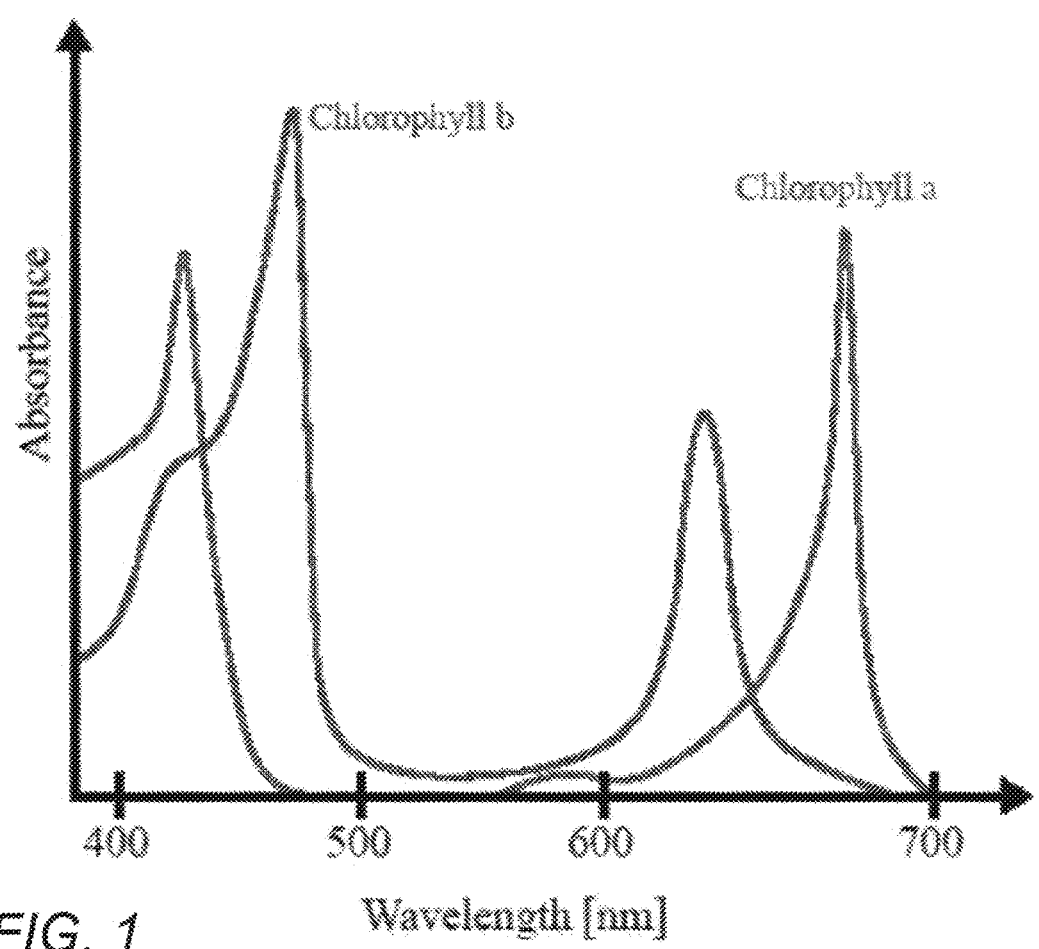
FIG. 1 depicts the absorption spectrum of both chlorophyll a and chlorophyll b. The use of both together enhances the amount of absorbed light for producing energy storage assimilates.
Figure 2A:
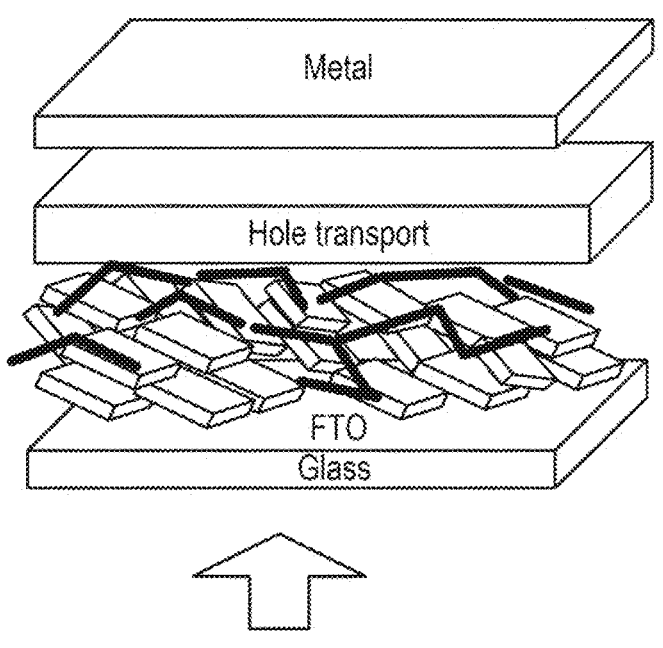
FIGS. 2A-B provide schematic representation of (FIG. 2A) a photovoltaic device according to certain embodiments of the invention, and (FIG. 2B) an inverted architecture device where MeO-2PACz serves as the hole transport layer and the PCBM and BCP are the electron transport layer.
Figure 2B:
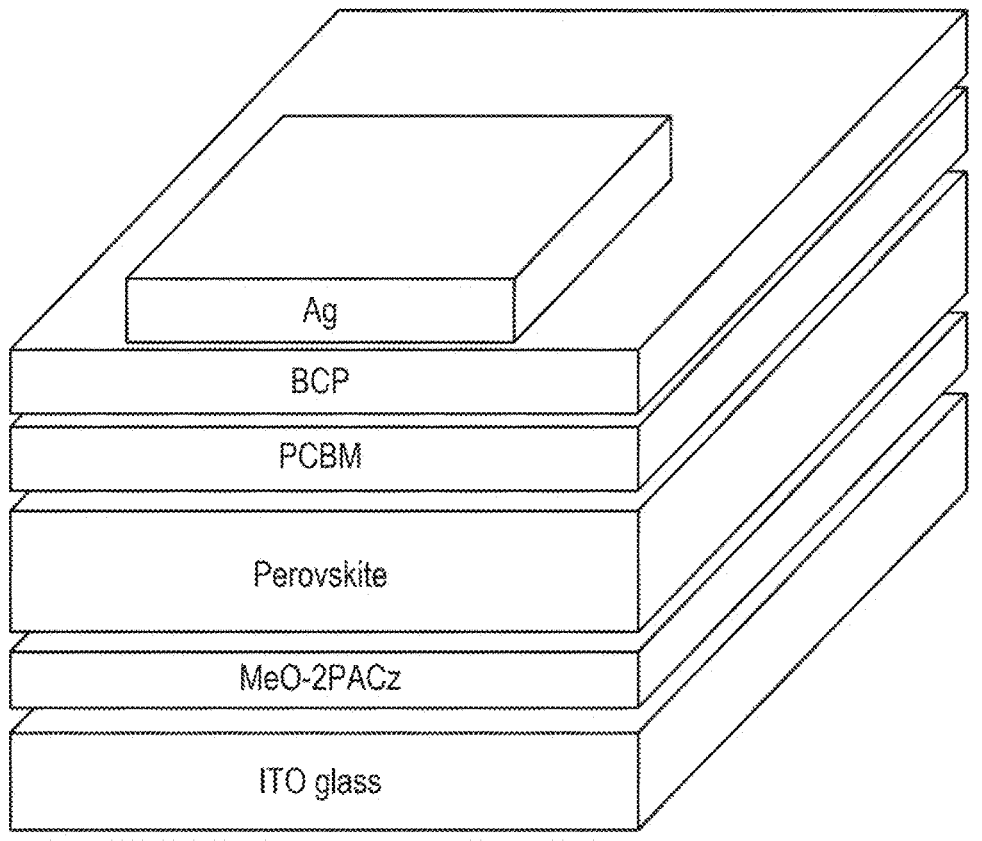

Perovskite Solar Cells for Greenhouse
Substrate Preparation 2.5 $cm^2$ ITO glass (TEC 12-15, Automatic Research) were etched by Zn powder and HCl (37%) to achieve the desired electrode pattern. The electrodes were then cleaned by Hellmanex solution (2% in DI water, Sigma Aldrich), DI water, Acetone, and Isopropyl alcohol in an ultrasonic bath for 15 minutes each.

Perovskite Solution Preparation

A 1M solution of $Cs_{0.2}FA_{0.8}Pb(I_{0.3}Br_{0.7})_3$ was prepared by weighing $PbBr_2$ (Sigma), FAI (GreatCell), and CsBr (Sigma) powders in the right stoichiometric amounts. The precursors were then dissolved in a mixture of Dimethyl-formamide (DMF, Acros)) and Dimethylsulfoxide (DMSO, Acros) in a ratio of 4:1, respectively. The solution was placed on a 60° C. hotplate and stirred over night before use.

Hole Transport Material (HTM) and Electron Transport Material (ETM) Solutions Preparation The hole transport material (HTM) solution was prepared by dissolving 0.3 mg of MeO-2PACz (TCI Chemicals) in 1 mL of anhydrous ethanol (Acros). The solution was then sonicated for 10-15 minutes until it was completely clear. In order to form the electron transport material (ETM) solution a 30 mg of $PC_{61}BM$ (Ossila) were dissolved in 1 mL of chlorobenzene (Sigma) and stirred overnight at 60° C. before use.

Solar Cell Fabrication

The hole transport layer was prepared by spin-coating the MeO-2PACz solution at 3500 rpm for 35 seconds follow by 10 minutes annealing at 100° C. After the substrate cooled to room temperature, 100 µl of perovskite solution was drop on top of it and spin coated at 1000 rpm for 10 seconds followed by 3500 for 35 seconds. 10 seconds before the end of the program 180 µl of anhydrous Chlorobenzene (Sigma) were dropped on the spinning substrate to force crystallization. The perovskite layer was annealed at 100° C. for 40-60 minutes. After cooling down to room temperature 100 µl of PCBM solution were dynamically spin-coated at 2000 rpm for 30 seconds and annealed at 100° C. for 10 minutes forming the electron transporting layer. A 1 mg/ml bathocuproine (BCP, Ossila) solution in isopropyl alcohol was spin-coated on top of the PCBM layer at 6000 rpm and annealed at 70° C. for 5 minutes. To complete the device a 100 nm Ag back contact was thermally evaporated in 3 steps. The first 10 nm at a rate of 0.1 A/sec, followed by 35 nm at a rate of 0.5 A/sec, and finally 55 nm at a rate of 1.1 A/sec.

Results

Figure 3A:
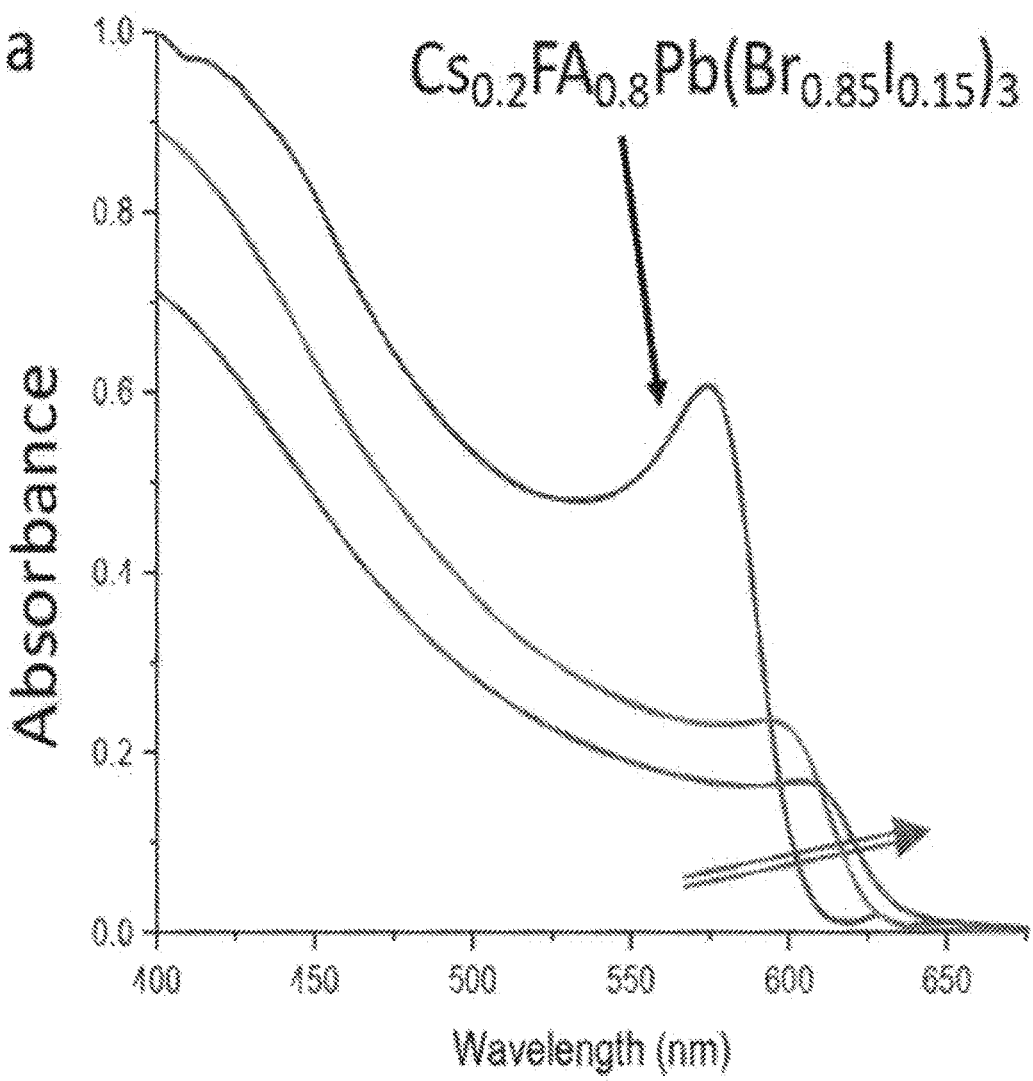
FIGS. 3A-B show (FIG. 3A) absorbance spectra of mixed cation perovskite at different compositions.
Figure 3B:
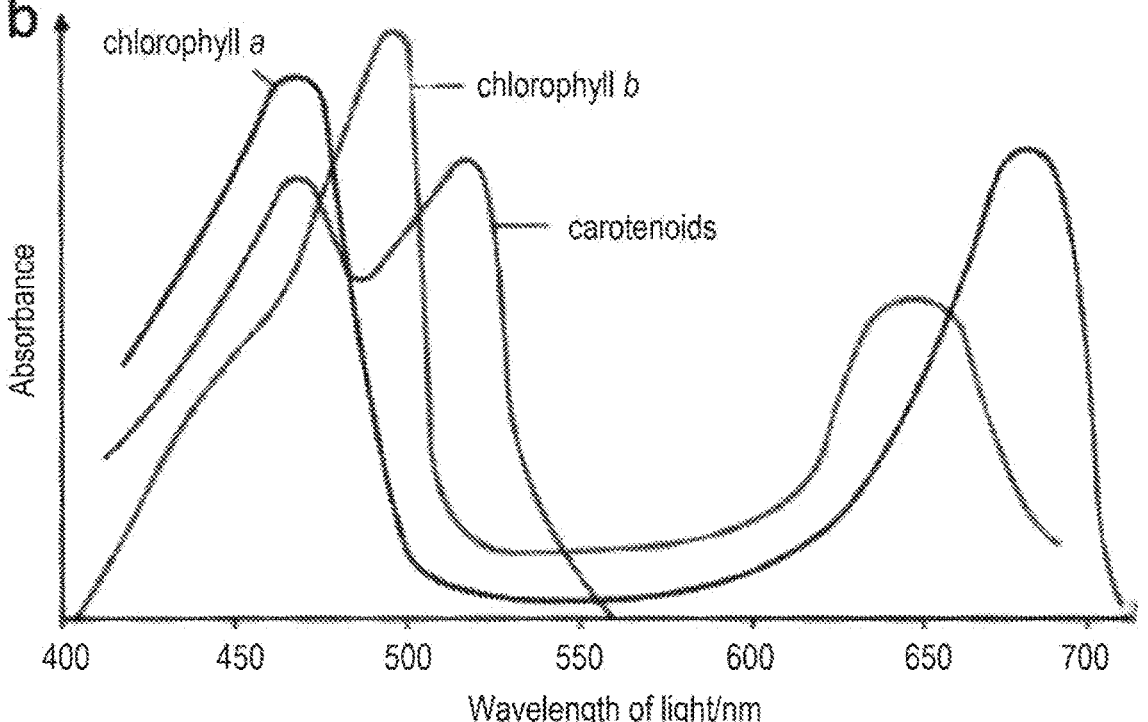

The perovskite band-gap can be easily tuned by changing the bromide/iodide halide ratio which affects the electronic properties of the perovskite. As can be seen in FIG. 3A the absorbance edge of the perovskite layer is shifted towards shorter wavelength when the bromide ratio getting higher. For 85% bromide ratio the absorbance edge is at ~600 nm. This absorbance is in an excellent correlation to the plant's pigments absorption as presented in FIG. 3B. It can be seen that chlorophyll a (blue curve) and chlorophyll b (red curve) have two separate absorbance regions, the first at ~400-525 nm and the second at ~600-700 nm. Therefore, when combining between the two, the perovskite film will allow the plant to absorb the essential wavelength for the chlorophyll activity.

Figure 4A:
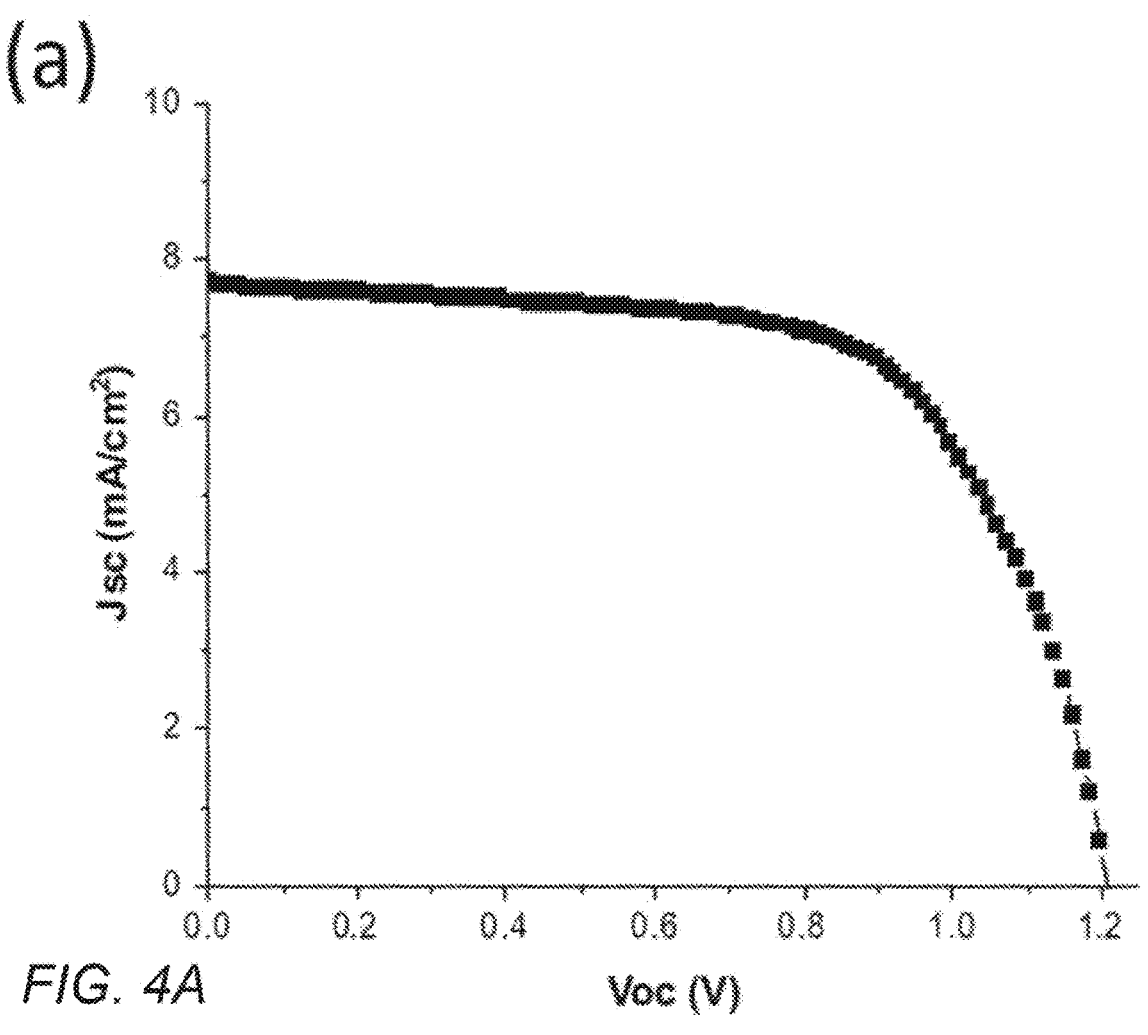
FIGS. 4A-B show (FIG. 4A) current voltage curve of the solar cell having wavelength cutoff at 600 nm.
Figure 4B:

The mixed cation perovskite composition of $Cs_{0.2}FA_{0.8}Pb$ $(I_{0.15}Br_{0.85})_3$ showed very good photovoltaic (PV) parameters as reflected from Table 1. It can be seen that the Voc is 0.95V and the Jsc is 7.7 mA/cm$^2$ which yielded a power conversion efficiency (PCE) of 6.6%. The current voltage curve can be observed in FIG. 6. Two main reasons are responsible for this PV performance. First, the device is in an inverted architecture which based on organic ETL and HTL with better conductivity and energy bands alignment. Second, the perovskite structure composed from a mixture of FA$^+$ (Formammidinium) and Cs$^+$ (Cesium) which reduced the perovskite band-gap in comparison to the MA$^+$ based perovskite. As can be seen in FIG. 4 the film has an orange-red color with some transparency. This perovskite is based on $Cs_{0.2}FA_{0.8}Pb(I_{0.15}Br_{0.85})_3$ film that expressed a cutoff wavelength at 600 nm. The red color derives from the halide composition which based on a majority of bromide (85%). As a result, the absorbance edge is shifted towards shorter wavelengths allow more light (in longer wavelength region) to pass throughout the perovskite layer which makes it semitransparent.

Figure 5:
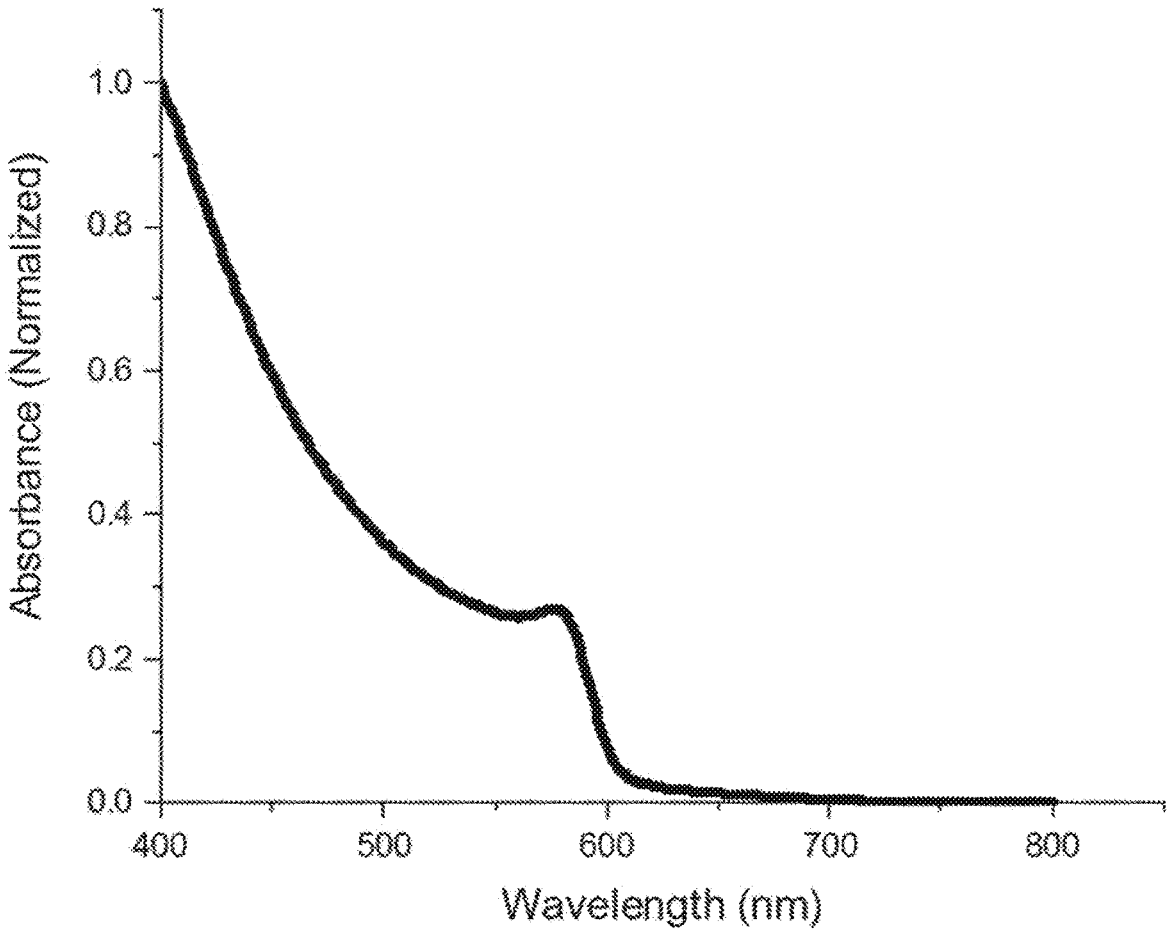
FIG. 5 provides the absorbance graph for $MA_{0.25}FA_{0.75}Pb$ $(I_{0.25}Br_{0.75})_3$ with an absorbance edge of ~600 nm.

Various perovskite materials may be utilized according to the invention. As disclosed herein, suitable perovskites may be identified by measuring the absorbance spectrum of the material. For example, as shown in FIG. 5, the absorbance spectrum for $MA_{0.25}FA_{0.75}Pb(I_{0.25}Br_{0.75})_3$ having an absorbance edge of ~600 nm provides a good correlation to plant absorbance spectrum.

Table 1 below presents the average photovoltaic parameters for 33 devices made with $MA_{0.25}FA_{0.75}Pb(I_{0.25}Br_{0.75})_3$

TABLE 1

Average photovoltaic parameters of the solar cell utilizing $MA_{0.25}FA_{0.75}Pb(I_{0.25}Br_{0.75})_3$.

| Voc (V) | Jsc (mA/cm$^2$) | Fill Factor (%) | Efficiency (%) |
|---|---|---|---|
| 0.95 ± 0.29 | 7.7 ± 3.2 | 69.9 ± 14.2 | 6.6 ± 2.7 |

Figure 6:
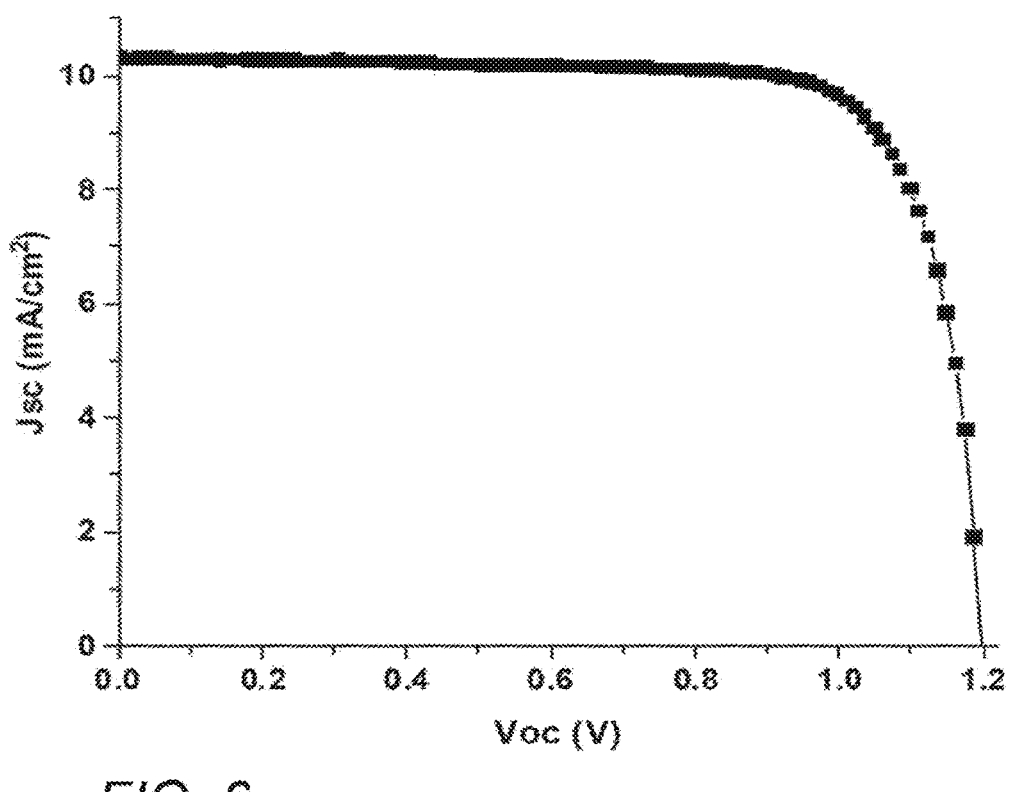
FIG. 6 provides a J-V curve graph of device according to the invention.

FIG. 6 shows the J-V curve of the photovoltaic device utilizing $MA_{0.25}FA_{0.75}Pb(I_{0.25}Br_{0.75})_3$. The photovoltaic parameters of this device are summarized in Table 2.

TABLE 2

Photovoltaic parameters of the solar cell utilizing $MA_{0.25}FA_{0.75}Pb(I_{0.25}Br_{0.75})_3$.

| Voc (V) | Jsc (mA/cm$^2$) | Fill Factor (%) | PCE (%) |
|---|---|---|---|
| 1.2 | 10.3 | 78 | 9.7 |

Figure 7:
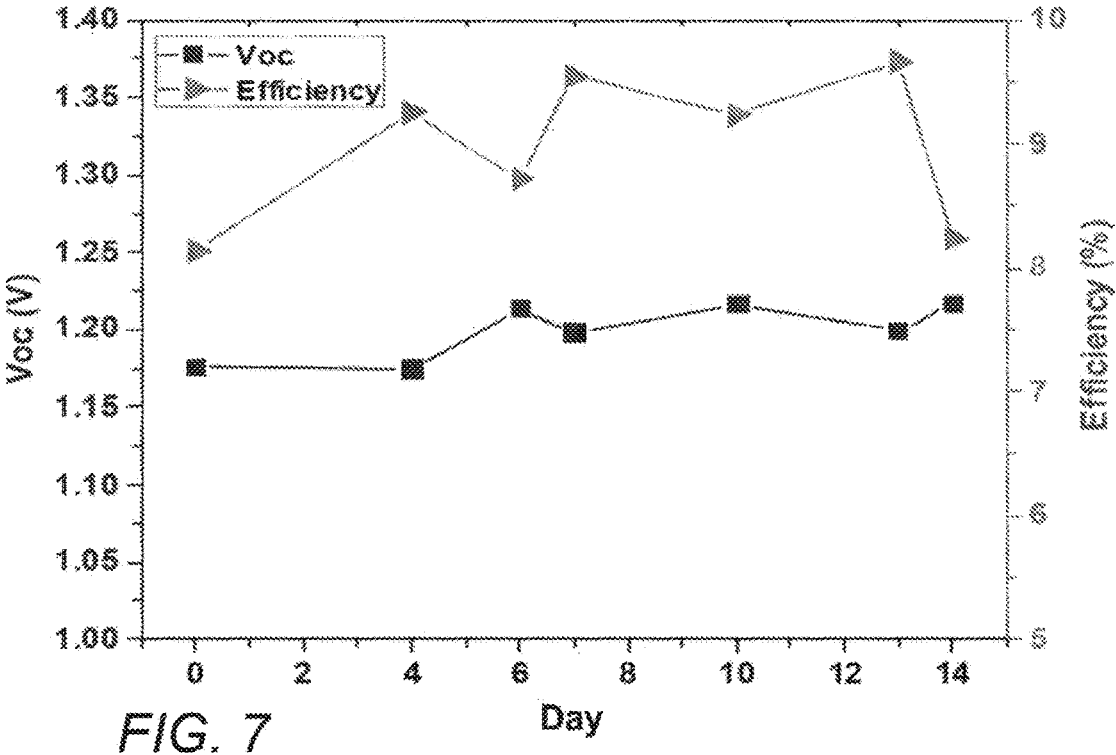
FIG. 7 shows the voltage and efficiency stability graph for a device maintained under ambient conditions for two weeks.
Figure 8:
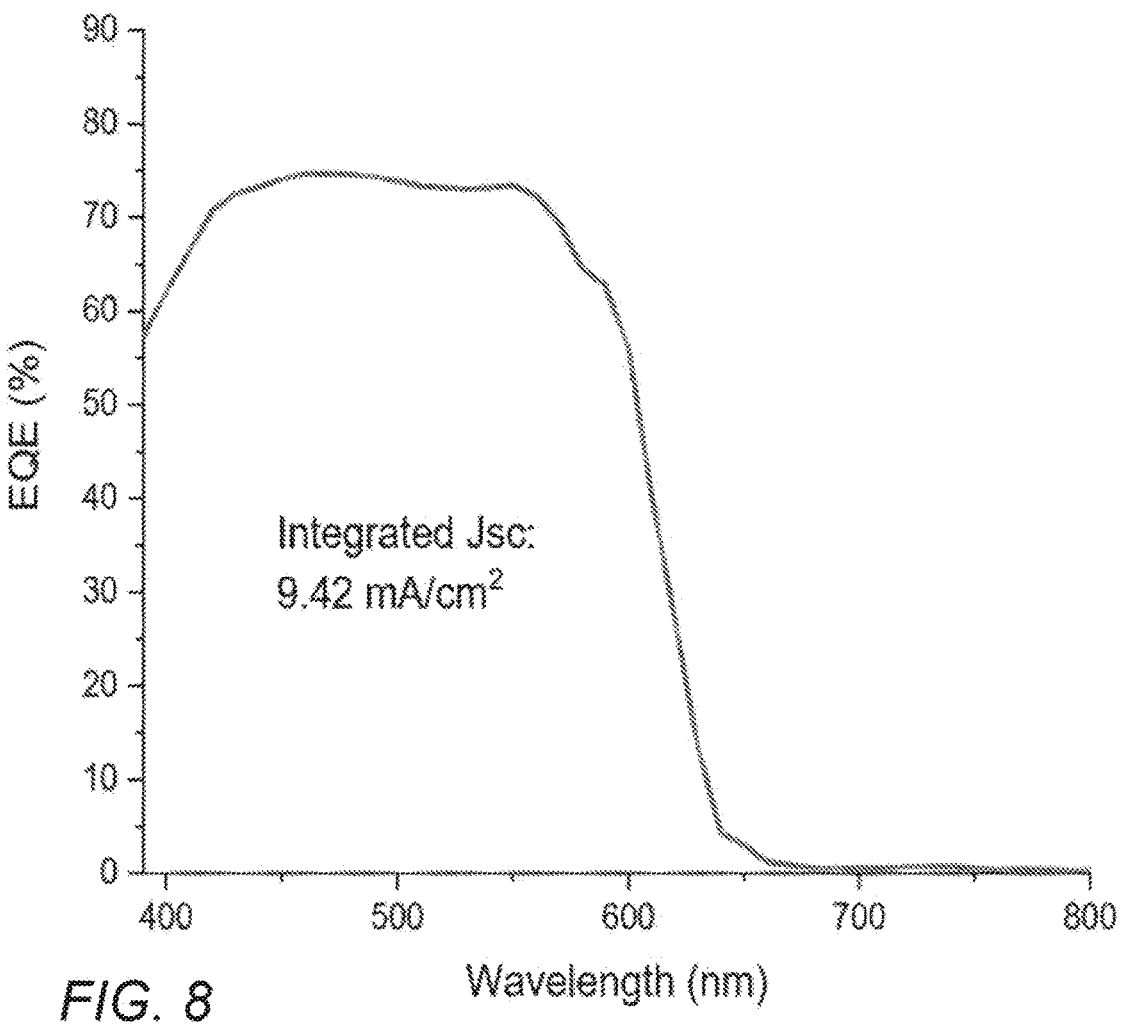
FIG. 8 provides the External Quantum Efficiency (EQE) graph for a device of the invention.

Stability graphs for the device of Table 2 kept under ambient conditions for two weeks are shown in FIG. 7. It can be seen that both parameters did not show any degradation during this time. FIG. 8 shows the EQE spectra of the corresponding device which demonstrates a good agreement between the measured Jsc (by the solar simulator) to the integrated Jsc value extracted from the EQE spectra.

The invention claimed is:

1. An agricultural structure comprising a photovoltaic device provided on the structure's roof and/or provided as a roof panel, the photovoltaic device comprising a transparent or semitransparent film comprising or consisting of at least one perovskite material absorbing light within the photosynthetically active radiation (PAR) spectrum,
   wherein the at least one perovskite material is $MA_nFA_{1-n}Pb(I_xBr_{1-x})_3$, wherein variable x is 0.2-0.3 and variable n is 0.2-0.3; or $Cs_nFA_{1-n}Pb(I_xBr_{1-x})_3$, wherein variable n is 0.15-0.25 and variable x is 0.2-0.4; and
   wherein the photovoltaic device is configured to selectively convert light to electricity at wavelengths of 400-610 nm and below, while transmitting light at wavelengths of 620-700 nm.

2. The structure according to claim 1, wherein the film is provided on a transparent substrate, having a two dimensional or three-dimensional (curved) surface, wherein the substrate is optionally conductive.

3. The structure according to claim 1, comprising or consisting of a substrate, the transparent or semitransparent perovskite film, at least one conductive layer, optionally a scaffold structure layer, and further optionally at least one hole conductive layer.

4. The structure according to claim 3, comprising:
   a conductive transparent substrate;
   the film of a perovskite material;
   optionally a hole transporter layer; and
   a metal contact.

5. The structure according to claim 1, comprising
   a titanium oxide continuous conductive layer; and
   a titanium oxide particulate layer.

6. The device according to claim 1, wherein the perovskite is $MA_{0.25}FA_{0.75}Pb(I_{0.25}Br_{0.75})_3$, or $Cs_{0.2}FA_{0.8}Pb(I_{0.3}Br_{0.7})_3$, or $MA_nFA_{1-n}Pb(I_xBr_{1-x})_3$, wherein each of x and n, independently of the other, is between 0.2 and 0.3, or $Cs_nFA_{1-n}Pb(I_xBr_{1-x})_3$, wherein n is between 0.15 and 0.25 and wherein x is between 0.2 and 0.4.

7. The device according to claim 1, wherein the perovskite is $MA_{0.25}FA_{0.75}Pb(I_{0.25}Br_{0.75})_3$.

8. The device according to claim 1, wherein the perovskite is $MA_nFA_{1-n}Pb(I_xBr_{1-x})_3$, wherein each of x and n, independently of the other, is between 0.2 and 0.3.

9. A method for reducing growing temperatures in an agricultural structure in accordance with claim 1, the method comprising allowing a portion of incident solar radiation to irradiate into the facility through said photovoltaic device to thereby filter the incident light and reducing temperatures within the facility.

10. The method according to claim 9, wherein the photovoltaic device is one or more roof panels.

\* \* \* \* \*